(12) United States Patent
Phillips et al.

(10) Patent No.: US 7,487,078 B1
(45) Date of Patent: Feb. 3, 2009

(54) METHOD AND SYSTEM FOR MODELING DISTRIBUTED TIME INVARIANT SYSTEMS

(75) Inventors: Joel R. Phillips, Sunnyvale, CA (US); Luca Daniel, Cambridge, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 518 days.

(21) Appl. No.: 10/326,679

(22) Filed: Dec. 20, 2002

(51) Int. Cl.
*G06F 17/50* (2006.01)
*G06G 7/62* (2006.01)

(52) U.S. Cl. .............................. 703/19; 703/13; 703/14

(58) Field of Classification Search .................. 703/19, 703/13–14, 2
See application file for complete search history.

(56) References Cited

U.S. PATENT DOCUMENTS

| | | | | |
|---|---|---|---|---|
| 5,689,685 A * | 11/1997 | Feldmann et al. | ............... | 703/2 |
| 5,808,915 A * | 9/1998 | Troyanovsky | ................. | 703/14 |
| 5,920,484 A * | 7/1999 | Nguyen et al. | ................. | 703/2 |
| 6,115,670 A * | 9/2000 | Druskin et al. | ................. | 702/7 |
| 6,151,698 A * | 11/2000 | Telichevesky et al. | .......... | 716/1 |
| 6,188,974 B1 * | 2/2001 | Cullum et al. | ................. | 703/14 |
| 6,349,272 B1 * | 2/2002 | Phillips | ......................... | 703/2 |

OTHER PUBLICATIONS

Joel R. Phillips "Efficient full-wave electromagnetic analysis via model-order reduction of fast integral transforms" ACM 1996.*
"Model Reduction of Time-Varying Linear Systems Using Approximate Multipoint Krylov Subspace Projectors", Joel Phillips, ACM 1998. pp. 96-102.*
"Model Order Reduction for Strictly Passive and Causal Distributed Systems" Daniel et al. DAC Jun. 2002.*
"Guaranteed Passive Balancing Transformations for Model Order Reduction" Phillips et at. DAC Jun. 2002.*
"Reduced-Order Modeling Techniques Based on Krylov Subspaces and Their Use .in Circuit Simulation", Fruend. Bell Labs 1998.*
"Krylov-subspace methods for reduced-order modeling in circuit simulation", Freund. Bell Labs 1999.*
"Improved Global Rational Approximation Macromodeling Algorithm for Networks Characterized by Frequency-Sampled Data", Elzinga et al. IEEE Sep. 2000.*
"Krylov-Subspace-Based Order Reduction Methods Applied to Generate Compact-Electro-Thermal Models for MEMS", Bechtold et al. Nov. 2002.*

* cited by examiner

*Primary Examiner*—Kamini Shah
*Assistant Examiner*—Saif A Alhija
(74) *Attorney, Agent, or Firm*—Vista IP Law Group, LLP.

(57) ABSTRACT

A reduced order model of a distributed time invariant system is produced by projecting system matrices onto smaller matrices, interpolating the matrices and placing into a state-space system. The system matrices are an internal representation of the distributed time invariant system which comprises a description of the system to be modeled, mainly, for example, its inputs and outputs. The method is applied to distributed systems and guarantees accuracy in complicated systems and produces well-behaved models appropriate for use in simulators and simulations.

38 Claims, 3 Drawing Sheets

Real part and imaginary part divided by ω of the frequency response for the lossy substrate example.

Figure 2: Real part and imaginary part divided by ω of the frequency response for the lossy substrate example.

Model Reduction Process

METHOD AND SYSTEM FOR MODELING DISTRIBUTED TIME INVARIANT SYSTEMS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to modeling behavior of distributed time invariant systems, and is more particularly related to the modeling of distributed time invariant devices used in the design of integrated circuits. The present invention is yet further related to the preparation of reduced order models of distributed time invariant devices and their use in simulators.

2. Discussion of Background

Design of modern high-performance electronic systems such as RF circuits, optical transceiver ICs, and global digital signal interconnect requires careful attention to physical modeling so that the intrinsic physical limitations of implementation processes can be accounted for, and undesirable effects such as signal integrity problems and excessive electromagnetic interference (EMI) can be minimized. Effective design of complicated systems requires simple models, and this simplicity requirement conflicts with the need for accuracy, as a high degree of physical fidelity can only be achieved by detailed analysis, such as with electromagnetic field solvers. Model reduction is now a standard procedure for obtaining simple models of complicated physical systems.

The design process of modern systems can be broken down into 3 levels of abstraction. First, a system designer who is responsible for an overall design (e.g., cell phone, wireless LAN, a chipset, etc.). The system designers are working at the very highest level of abstraction, and typically think in terms of software, what data needs to be transmitted between various components of a design, and processing of the data. At a second, lower level of abstraction, which we will call a circuit design level, we find engineers that are designing the circuits that actually do the operations envisioned by the system designers. At the circuit design level, the engineers are thinking in terms of things like transistors, resistors, inductors, and other components. The circuit design engineers run the simulation tools like SPICE, or other SPICE class simulations, signal processing performed in C language, etc., these tools are often based on solving differential equations or ordinary differential equations.

And then, at a lowest level of abstraction, which can be referred to as the physical level, scientists and physicists analyze and describe an actual physical object (e.g., properties of a piece of metal, or silicon). The physicists task is to describe the piece of metal, for example by calling it a piece of metal, noting its size shape, etc, and writing down Maxwell's equations for that piece of metal and describe it in detail. Here, the physicist is describing the object by calling it a component name, such as a resistor or inductor, and making it an abstract object that can be used by the engineers at the next higher design level.

The description of the metal then provides a very detailed account of the properties of the component it embodies. The properties are typically described in a set of ordinary and partial differential equations based on the geometry and properties of the metal. The set of equations is large and complicated and are needed because a very accurate description of that particular component is critical to the functioning of a system being designed at the higher levels. Further, the component may need to be placed in some structure that is, for example, a package for an IC or some very complicated structure like an integrated inductor on a chip.

Now, turning back to the highest level of abstraction, the system designers certainly have some idea that maybe there is an inductor or other components in the system, but they would not likely be involved about the properties or placement of those components. Then, at the circuit level, the engineers know about the placement and certain qualities of the inductors, and are aware that the inductor is a physical component. And, so the entire process can be viewed as starting from the physical level, a design begins from a very detailed description of the object and then to generate some model that we call a macromodel, or reduced order model, (either by hand or via an automated process such as model reduction) so that the circuit level engineers can generate circuit designs which are used by the system designers to complete a system.

So, starting with the physical geometry of the metal and the properties of the metal, its shape, etc., the physicist is figuring out how it is going to react when placed in either a resistor, inductor, or other component configuration. The problem is that the description that accurately describes these properties might be 10K equations to describe one component. And, in a particular circuit there may be 10K RLCs that are implemented. The resultant 10,000, 100,000, or one million different equations need to be evaluated, which is a cumbersome and not really practical even with modern high speed processing capabilities.

The physical level differential equation descriptions are very accurate, and what is needed is to get from that very accurate but cumbersome description to a simpler more manageable formula (converting a very detailed level geometrical to a more abstract circuit type description) that can be simulated using currently available technologies. There are many ways to generate such simplified models, the most common procedure being for a skilled engineer to craft each model by hand. Because by hand model generation is very labor intensive and requires highly skilled and experienced individuals to perform the task, it is attractive to seek an automated procedure for generating the macromodels. An automatic procedure that generates reduced order models from detailed physical equations is called a model order reduction procedure.

Thus, model reduction forms a bridge between the detailed physical level of analysis and the circuit or system level where design is performed by extracting a simple behavioral model from the complicated lower level description. Model reduction addresses three primary issues, each of which can be identified with a stage of evolution of the research field.

First, the models that are produced must be accurate. The attractiveness of model reduction procedures, over other behavioral modeling approaches, is that they offer a systematic way to control and predict the accuracy of the reduced models. This requirement led to the proliferation of moment-matching approaches.

Second, it must be possible to generate a model, of arbitrary order, in a numerically stable way. Early moment-matching approaches suffered from numerical instability problems that prevented reliable computation of high-order models. This requirement eventually led to the Krylov-subspace algorithms such as PVL that stabilize the interpolation procedures.

Third, the models that are generated must be well-behaved when embedded into a simulation tool with models of other physical elements. While not possible to guarantee that the reduced model will not have unintended consequences in every possible simulation, a reasonable procedure is to require that the models themselves do not possess non-physical properties. For example, components such as interconnect do not generate energy; they are passive. Thus, much work in model reduction in the past several years has been concerned with passivity-preserving procedures such as those based on congruence transforms.

In the past, model order reduction was performed in a number of ways. For example, engineers have simulated the descriptions and tried to perform some type of curve fitting (a popular method), which basically comprises plotting out the model as a function of frequency and then trying to fit a curve through it. Or, in another method plotting a transfer function and maybe some of its derivative around a point of interest. Each of these methods try to approximate the transfer function with a smaller set of equations or a function. However, these standard curve fitting methods are used only in limited or restricted contexts and have some large problems associated with them. For example, when curve fitting is performed around a point of interest or for certain frequencies, the results can be quite good. But when placed in a simulation tool, and particularly at different frequencies, the behavior of the curve fit equations are not entirely predictable nor dot they necessarily behave like the materials which they are to be approximating. Changes in behavior can be so different that in some scenarios passive materials can have curve fit models that appear active. As another example, rational function approximation of data from functions exhibiting sharp resonant behavior (i.e. near where the denominator of the rational function approaches zero) is problematic because of the potentially high data density needed near the resonance, as well as the increased dynamic range of the data.

Referring now to FIG. 1, there is provided an illustration of different types of equations and different algorithms 100 that have been utilized to attempt to solve the order reduction problems. FIG. 1 illustrates the different types of systems which are linear, non-linear, distributed, time varying, and time invariant. The systems themselves can generally be divided into lumped and distributed systems. Broadly speaking, the type of models needed to represent a system of interest is dependent on whether the system of interest is lumped or distributed.

In one previous system, described in Phillips, U.S. Pat. No. 6,349,272, entitled "Method and system for modeling time-varying systems and non-linear systems," the contents of which are incorporated herein by reference, there is described a reduction method that is directed towards a special class of systems called time varying systems 110.

Other systems that address model reduction, but for a limited class of designs or properties, include Cullum et al. (U.S. Pat. No. 6,188,974) (e.g., 120), Feldmann et al. (U.S. Pat. No. 5,689,685) (e.g., 130), Ngyuen et al. (U.S. Pat. No. 5,920,484), and Celik et al. (IEEE Trans. CAD, 16(5). pp. 485-496). However, each of these systems are limited in that they only operate on limited classes of systems, or are otherwise limited to low frequency analysis.

For RLC circuits many methods exist that can generate adequate reduced model representations. Likewise, it is known how to formulate RLC circuit equations such as to guarantee stability and positive-realness of the reduced models, which is sufficient to guarantee that the reduced models belong to the same class (passive systems) as the full models from which they were derived. However, not all systems of interest in IC design are lumped. At high frequencies, distributed effects become necessary to model. For example, full-wave integral-equation based field solvers generate frequency-dependent matrices that cannot be used as inputs to the standard model-reduction procedures that require constant matrix representations. In fact, most integral formulations that model either frequency or spatial variation (such as those with layered-media Green functions and most surface integral formulations) contain distributed parameter descriptions. However, very few methods exist for reduction of distributed systems, and are either limited to very specific geometric structures (e.g., Celik et al. IEEE Trans. CAD, 16(5). pp. 485-496) or have no guarantees as to passivity or positive-realness properties (Cullum et al. U.S. Pat. No. 6,188,974).

SUMMARY OF THE INVENTION

The present inventors have realized the need for providing a model reduction system that satisfies the requirements for describing components used in designs such as circuits and IC electronic devices for a wide class of distributed systems. The present invention takes a time-invariant frequency-domain model description, and provides, as output, a time-invariant finite dimensional state-space model whose transfer function is a rational approximate of the original (infinite-order, possibly irrational) transfer function. The present invention only requires matrix-implicit operations such as matrix-vector products, and is therefore suitable for incorporation of modern fast integral equation solvers.

The present invention produces a reduced model for the distributed time invariant systems noted in FIG. 1. These systems are distributed in that they have a parameter like frequency or another, perhaps external, parameter in which behavior changes significantly as the parameter changes.

In one embodiment, the present invention provides a method of order reduction of a distributed time invariant system, comprising the steps of, determining a set of points from a representation of the distributed time invariant system, computing a basis Q for a projection operation of the set of points, projecting system matrices Z(s) to obtain smaller matrices Zp(s), performing a global interpolant of the projected system matrices, reformatting the interpolant projected system matrices as a state-space system.

In another embodiment, the invention is a method, comprising the steps of, deriving a distributed, frequency based model describing behavior of a material, reducing an order of the model, and applying the reduced order model to a simulation of a component described by the material.

In yet another embodiment, the invention is a method of simulating a system including at least one distributed time invariant component, comprising the step of running a device that utilizes a reduced order model of the distributed time invariant component.

In another embodiment, the invention is a reduced order model generator, comprising, a data store comprising, at least one frequency domain representation of a system, and at least one set of input and output specifications for the system, a model generator configured to construct a reduced order model from the frequency domain representation and the input and output specifications of the system, wherein said system comprises a distributed time invariant system.

In yet another embodiment, the invention is a device designed using a simulation tool wherein at least one component of the device was represented in the simulation tool as a reduced order model of a distributed time invariant system.

Portions of both the device and method may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
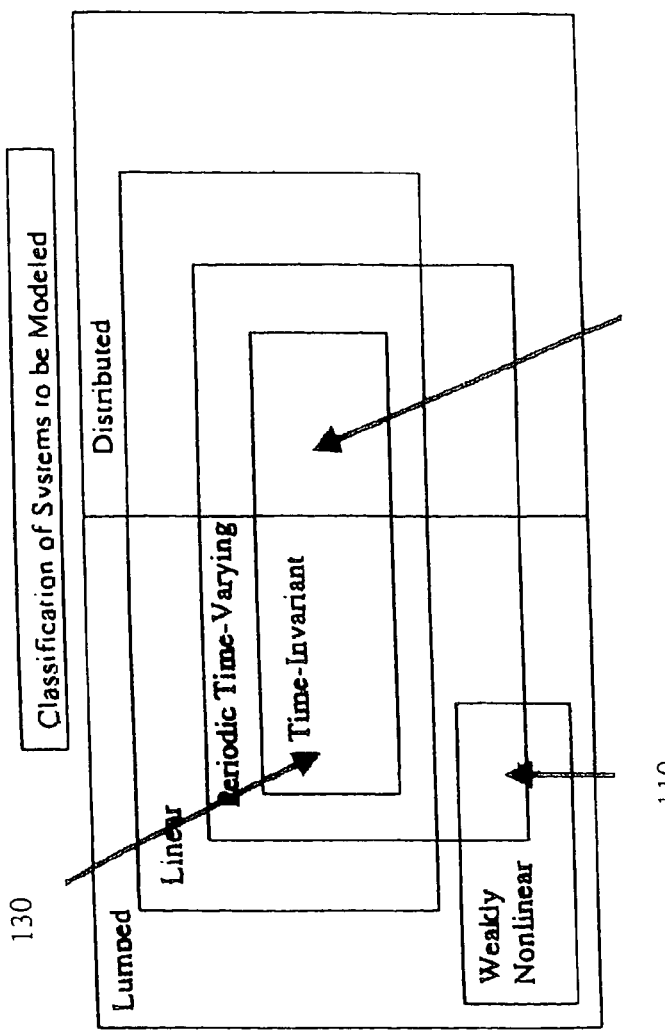
FIG. 1 is an illustration of different types of equations and different algorithms that have been utilized to attempt to solve order reduction problems.
Figure 2:
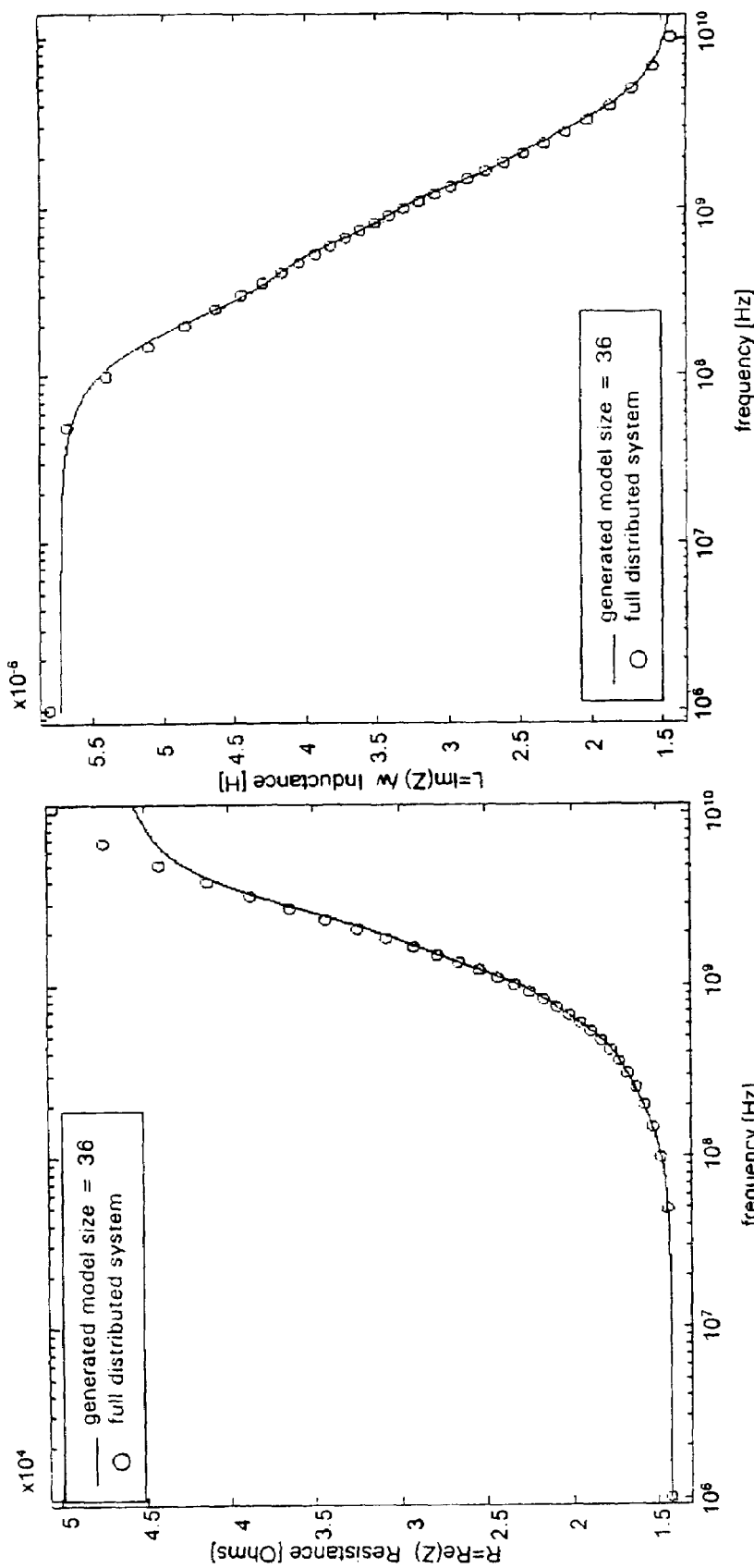
FIG. 2 is a graphical comparison of resistance and inductance of an original system having a lossy substrate on line impedance and a linear state space model derived according to the processes of the present invention.

The present invention relates to modeling behavior of distributed time invariant systems. In general, the modeled systems are time invariant in that the properties of the modeled system will not change with time (i.e., the modeled system behaves the same (same input=same output) regardless of a time frame in which the inputs are applied). However, the modeled systems are also distributed, meaning they are affected by frequency (or other parameter). For example, an integrated inductor behaves differently at a high frequency as compared to its low frequency behavior. Thus, the properties of the modeled system, depending on frequency, can vary significantly.

We now review some general concepts that relate to the present invention. Consider a modeled device, having inputs u, outputs y, and other descriptive matrices of the modeled device. The modeled device includes A(s), which is a complete description of the behavior of the modeled device. The modeled device is, for example, a model of a piece of metal that has properties consistent with any one of a number of electronic components (resistor, inductor, capacitor, etc.). A(s) is derived from the physics of the material from which the modeled device is constructed, e.g., using Maxwell's equations to evaluate the material, its geometry, etc. Then, the modeled device is described as:

$$u \to A(s) \to y \quad (a1)$$

A(s) operating on the inputs u, to produce y. Also illustrated are B(s) and C(s) (response matrices), which are matrices that describe basic connections to the modeled device (e.g., describing how the modeled device is connected, how the inputs and outputs are connected to the actual material being described by A(s). B(s) and C(s) model how those connections affect on how the modeled device responds to various inputs. These matrices are constant, unless the inputs and outputs are changed or relocated to different positions or connection types to the material. The response matrices are related according to the equation:

$$sIx(s) = A(s)x(s) + Bu(s), \quad (a2)$$

where sI x(s) is a Laplace transform with variable frequency of an identity matrix (all 1's matrix), and $$y = Cx(s); \quad (a3)$$

A transfer function H(s) for the modeled device can be described as:

$$H(s) = C(sI - A(s))^{-1}B; \quad (a4)$$

And, a relationship of the inputs to the outputs can also be described as:

$$y(s) = H(s)u(s) \quad (a5)$$

For purposes of the present invention, each of A, B, and C are provided by analysis of the material making the modeled device. A(s) comes from the properties of the metal including its geometry. B, and C are derived from connections of the modeled device and other environmental factors. However, other factors, embodied in other matrices that are either similar or having different factors/qualities associated with them may also be reduced according to the processes of the present invention. Further, the matrices as discussed herein are mainly directed toward models of materials used in electronic components, but other systems may also be similarly modeled and reduced using the techniques described herein.

Now, the present invention is described in further detail along with a discussion of supporting mathematics. First, we discuss properties of an abstract system of an abstract system H transforming vector input signals u into a vector of output signals y=Hu. For simplicity of exposition we will assume that the system inputs, u: $\mathbb{R}^+ \to \mathbb{R}^P$ represent port voltages, and that the outputs y: $\mathbb{R}^+ \to \mathbb{R}^P$ represent port currents, or the converse (the inputs are currents and the outputs voltages). The Laplace-domain representation of the system H is then a matrix H(s), s.t. y(s)=H(s)u(s), where u(s) and y(s) are the Laplace-domain representations of inputs u(t) and outputs y(t). Hence, H(s) is an immittance function: either an admittance matrix Y(s), or an impedance matrix Z(s). Let us introduce two inner products in X, the standard inner product $\langle u, y \rangle = \int_{-\infty}^{\infty} y(t)^\tau u(t) dt$, and a product which acts on truncated signals $\langle u, y \rangle_\tau = \langle u_\tau, y \rangle = \langle u, y_\tau \rangle = \int_{-\infty}^{\tau} y(t)^\tau u(t) dt$, where $u_\tau(t) = \{u(t)$ if $t \leq \tau, 0$ if $t > \tau\}$.

If u and y are port current/voltage pairs, $\langle u, y \rangle$ is the total energy dissipated by the system up to time $\tau$. We will generally work in the space of signals $x \in X = L_2$ that have finite norm $\|x\|$ for any $\tau$, where $\|x\|^2 = \langle x, x \rangle$.

Passive Systems. A passive system is a system that cannot produce energy. For the systems of interest here we may define:

DEFINITION 1 (PASSIVITY). A system H:X→X is passive if $\langle u, Hu \rangle_\tau \geq 0$, $\forall \tau \in \mathbb{R}^+$, $\forall u \in X$, u:[0: $\tau$]→$\mathbb{R}^P$.

In practice, almost all systems of interest for model reduction are non-ideal and contain some loss. That is, they internally consume energy. If a system consumes energy, it is said to be strictly passive.

DEFINITION 2 (STRICT PASSIVITY). A system H is strictly passive if there is a $\delta \in \mathbb{R}^+$ s.t. $\langle u, Hu \rangle_\tau \geq \delta \|u_\tau\|^2$, $\cup \tau \in \mathbb{R}^+$, $\forall u:[0, \tau] \to \mathbb{R}^P$.

Positive Real Systems. A related concept in network theory is that of positive realness.

DEFINITION 3 (POSITIVE REALNESS). A matrix valued function H(s) is positive-real (e.g., see B. D. Anderson and S. Vongpanitlerd. *Network Analysis and Synthesis*. Prentice-Hall, Englewood Cliffs, N.J., 1973, which is incorporated herein by reference) if $$\overline{H(s)} = H(s), \quad (1)$$

$$H(s) \text{ is analytic in } Re(s) > 0, \quad (2)$$

$$\Pi_H(s) \equiv H(s) + H(s)^* \geq 0 \text{ in } Re(s) > 0. \quad (3)$$

DEFINITION 4 (STRICT POSITIVE REALNESS). A matrix valued function H(s) is strictly-positive-real (e.g., see J. T. Wen. Time Domain and Frequency Domain Conditions for Strict Positive Realness. *IEEE Transactions on Automatic Control*, 33:988-992, 1988, which is incorporated herein by reference) if there exists an $\epsilon \in R^+$ s.t. $H(s-\epsilon)$ is positive-real.

Positive realness is of interest because of its relation to passivity for lumped networks:

THEOREM 1. A system H with rational system transfer function H(s) is passive and stable if and only if H(s) is positive-real.

In the context of model reduction, the implication for state-space systems is that if a reduction algorithm for lumped RLC networks produces models with positive-real transfer functions H(s), then it generates guaranteed passive models. Often the positivity condition (3) can be restricted to the imaginary axis, because of the following result:

THEOREM 2. A rational H(s) is positive-real and (1) and (2) hold, and $$\Pi_H(i\omega) \geq 0, \cup \omega \in R \quad (4)$$

except for simple poles $i\omega_0$ of H(s), where the residue matrix must be nonnegative definite. H(s) is strictly positive real if the inequality is strict.

THEOREM 3. If a rational matrix valued function H(s) is a representation of a passive system, then $H^{-1}(s)$ is positive-real.

Causal Systems. A causal system is a system whose output depends only on past inputs, not future inputs.

DEFINITION 5 (CAUSALITY). A system H is causal if $Hu = Hu_\tau$, $\cup \tau \in R^+$, $\cup u:[0,\tau] \to R^P$.

Physical systems are causal. Hence, causality is a property of models intended to be used in any simulator that has a concept of time. However, it is often neglected when modeling distributed systems. And, the condition in Equation (4) is not sufficient by itself to insure passivity. Further, passive systems are required to be causal (e.g., see M. R. Wohlers, *Lumped and Distributed Passive Networks*. Academic Press, New York, 1969 and H. M. Nussenzveig, *Causality and Dispersion Relations*. Academic Press, New York, 1972 which are incorporated herein by reference). If a system is not causal, it cannot be passive.

Example 1

Consider the one port (p=1) network function $Z_{skin}(i\omega) = R_0 + R_{ac}\sqrt{|\omega|}$ that is commonly used as a model for the "resistance" of interconnect in the skin-effect regime. This function satisfies the condition $\Pi_Z(i\omega) > 0$, $\cup \omega \Delta R$. However, it is not a representation of any passive system, because it is not a causal function. In fact, it can be shown that any physical, passive network function that is purely real must be constant with respect to the frequency ω.

Algorithms that generate successively better rational approximations of non-causal systems (for example, $Z_{skin}(i\omega)$) fail in some limit to be passive, for example by generating unstable approximants. Therefore we will utilize systems that are causal. The processes and methods of the present invention produce strictly positive-real (and thus strictly passive) approximations to causal and strictly positive-real (and thus strictly passive) system functions H(s).

Distributed Systems in Descriptor Form. Let us assume that an original distributed system (e.g. an interconnect network) has been described, for instance by the discretization step of an integral equation method, in terms of a frequency dependent matrix Z(s). Z(s) describes the couplings between all the discretization basis functions, and may be very large in the applications of interest. Many integral equation methods, when applied to distributed systems, produce Z(s) as a linear combination of matrices. One example is Z(s)=R(s)+sL(s), where R(s) and L(s) can still be in general frequency dependent. Incidentally this particular form for Z(s) may be advantageous for our approach although in general not necessary. We assume input and output information is of interest at some "ports" of the network for which the model is to be generated. The frequency-domain description of the system can be written as $$[R(s)+sL(s)]i_m(s)=Bv_p(s), i_p(s)=B^T i_m(s), \quad (5)$$

where $v_p(s) \in C^p$ and $i_p(s) \in C^p$ are Laplace-domain representations of voltages and currents at the p defined ports of interest, $i_m(s) \in C^n$ are the internal currents, and $B \in R^{n \times p}$ is a matrix relating ports to internal currents. In this case $u=v_p$ represents the system inputs (voltages), $y=i_p$ the system outputs (currents), and $x=i_m$ the internal states (also in this case currents). The transfer function from inputs to outputs is $H(s)=B^T[R(s)+sL(s)]^{-1}B$, $i_p(s)=H(s)v_p(s)$, and one view of model reduction is that it seeks an approximation to the transfer function H(s).

Projection Methods. Krylov-subspace based model reduction algorithms are projection methods (e.g., see P. Feldman and R. W. Freund. Reduced-Order Modeling of Large Linear Subcircuits via a Block Lanczos Algorithm. In *Design Automation Conference*, pages 474-479, June 1995; A. Odabasioglu, M. Celik, and L. T. Pileggi. Prime: Passive Reduced-Order Interconnect Macromodeling Algorithm. *IEEE Trans. on Computer-Aided Design of Integrated Circuits and Systems*, 17(8):645-54, August 1998; and Eric Grimme, *Krylov Projection Methods for Model Reduction*. Ph.D. Thesis, Coordinated-Science Laboratory, University of Illinois at Urbana-Champaign, Urbana-Champaign, Ill., 1997, which are incorporated herein by reference). One of the key insights in reducing distributed systems is that projection methods, and their approximation properties, apply to lumped systems as well as to distributed ones.

Given a matrix $Q \in R^{n \times q}$, an orthogonal projection method obtains a rational approximant (of dimension q), or, equivalently, a reduced model, via the congruence transformation $$\hat{R}(s)=Q^*R(s)Q, \hat{L}(s)=Q^*L(s)Q, \hat{B}+Q^*B. \quad (6)$$

The post-multiplication by matrix Q corresponds to projecting the original state vector of variables $i_m$ into the reduced space of basis functions represented by the q columns of matrix $Q: \hat{i}_m = Qi_m$. The pre-multiplication by matrix $Q^*$ in (6) reduces the number of equations to the new size of the state q.

After the congruence transformation step the linear system is $$[\hat{R}(s)+s\hat{L}(s)]\hat{i}_m=\hat{B}v_p(s), i_p(s)=\hat{B}^*\hat{i}_m(s) \quad (7)$$

where $\hat{R}, \hat{L} \in C^{q \times q}$; $\hat{i}_m(s) \in C^q$, $\hat{B} \in R^{q \times p}$. At this point, the projection operation is conceptual; the system of (7) contains a frequency-parameter and is thus infinite-dimensional. Finite-dimensional realizations are discussed below.

For lumped systems, the most popular approaches to model reduction generate the columns of the matrix Q by matching moments of the frequency domain response H(s), or, equivalently, derivatives of the time domain response. One possible method to obtain a very simple projection matrix Q for the congruence transformation in (6) is to construct each of the q columns of Q by solving the original full system (5) at q different frequency points. When the underlying system matrices R(s) and L(s) are defined implicitly, as in large-scale electromagnetic codes, this is not an inconvenience, and is in fact preferred as derivative information can be awkward to obtain.

The importance of congruence transformations in generating well-behaved reduced models stems from the following theorem.

THEOREM 4. If Z(s) is positive-real, then $\hat{Z}(s)=Q^*Z(s)Q$ is also positive-real.

PROOF. Conditions (1) and (2) in Definition 3 are easily verified. Condition (3) follows from observing that $\Pi_{\hat{z}}(s)=Q^*\Pi_Z(s)Q$, so range ($\Pi_{\hat{z}}$) ⊂ range ($\Pi_Z$).

The theorem implies that if the given infinite-dimensional system to be reduced is passive and can be described by a positive-real system matrix Z(s), then the model with smaller descriptor matrices obtained from the projection operation will represent a passive system as well, although still infinite-dimensional.

LEMMA 1. Given a system of the form in (5), if $\hat{Z}(s)=\hat{R}(s)+s\hat{L}(s)$ is [*strictly] positive-real, $\hat{H}(s)$ is [*strictly] positive-real (e.g., Odabasioglu et al.).

The proof follows from Theorems 3 and 4. From this Lemma, one way to obtain a positive-real $\hat{H}(s)$ is to find a positive-real $\hat{Z}(s)$. The positive-realness of $\hat{Z}(s)$ implies that all the poles and zeros of $\hat{H}(s)$ are in the left half-plane.

To illustrate some of the problems encountered in model reduction for distributed systems, consider the algorithm presented in (e.g., see J. R. Phillips, E. Chiprout, and D. D. Ling, Efficient Full-wave Electromagnetic Analysis via Model Order Reduction of Fast Integral Transforms. In *Design Automation Conference*, June 1996 which is incorporated herein by reference). The approach of the algorithm is a Taylor expansion of the system matrix descriptor $Z(S) \approx \Sigma_{k=0}^{N} Z_k s^k$, using polynomials as interpolants. A Krylov method is then applied to a system constructed from the Taylor expansion. This approach does not generate well-behaved models because the Taylor approximation is not globally well-behaved. In fact, all polynomials diverge in the s→∞ limit. Hence, although good accuracy can be achieved in a given frequency band of interest, global properties such as positive-realness cannot be guaranteed. Empirically, the resulting reduced models are often found to have unstable poles, the models are not passive, and thus the algorithm is of little practical value.

The present invention includes combining approximation of the Z(s) internal matrix descriptors with a Krylov method. However, almost all systems for which one would wish to extract reduced models are non-ideal (non-ideality is why they must be modeled in detail) and so contain a small amount of loss. These systems are strictly passive and can typically be described by strictly positive real system matrices.

The present invention is based on the observation that if a system descriptor is strictly positive-real to begin with, a globally and uniformly convergent interpolant will eventually (for a large enough order of the interpolant) be positive-real as well. (This will be seen in the proof of Theorem 5.) Furthermore, a well-chosen global interpolant will be positive-real for low enough orders to be practical. Local approximations based on Taylor and Padé typically do not have these properties.

The methods of the present invention are based on that the transfer function H(s) of the given large system be strictly positive-real, and that its internal system matrix descriptor Z(s) be strictly positive real (i.e. that the state-space description be internally positive-real). However, as discussed in Section 2 in a physical system, H(s) must also be causal. Hence, as for the positive realness property, we shall require that not only the transfer function H(s) of the given large system be strictly positive-real and causal, but also that its internal system matrix descriptor Z(s) be strictly positive-real and causal (i.e. that the state-space description be internally positive-real and causal. In this case we can restrict our search for approximations of Z(s) to the set of stable, positive-real interpolants. For non-causal Z(s), either accuracy or stability/passivity would have to be eventually sacrificed.

We propose an eight step method or process, which we term Global Rational Interpolation, Passive (GRIP):

1. Obtain/estimate/given a set of q points at which the transfer function at the network ports $H(s) \in C^{p \times p}$, is to be matched.

2. Compute the basis $Q \in C^{n \times q}$ for the projection operation (see Section 3).

3. Project the internal system matrices $R(s), L(s) \in C^{n \times n}$ to obtain smaller $\hat{R}(s), \hat{L}(s) \in C^{q \times q}$ as in (6). Note that this is a conceptual operation; the reduced matrices are still frequency-dependent, so the system is still of potentially infinite order.

4. Perform a global and uniform interpolation of the (projected) internal system matrices $\hat{R}(s), \hat{L}(s)$ (note Laguerre basis implementation discussed below).

5. Check the passivity (see W. F. Arnold and A. J. Laub, Generalized Eigenproblem Algorithms and Software for Algebraic Riccati Equations, *Proc. IEEE*, 72:1746-1754, 1984 which is incorporated herein by reference), and accuracy of the matrix interpolants. If not passive, or if matrix interpolants are not accurate, go to Step 4 and increase the order N of the global interpolant.

6. Check the accuracy of the reduced model transfer function $\hat{H}(s)$. If not accurate, go to Step 1 and add additional matching points q.

7. Realize as state-space system.

8. Perform a second-stage guaranteed-passive optimal reduction step, if desired (e.g., see J. Phillips, L. Daniel, and M. Silveira, Guaranteed Passive Balancing Transformations for Model Order Reduction. In *Design Automation Conference*, June 2002 which is incorporated herein by reference).

Step 5 can be performed solving the Lur'e equation in the Positive-Real Lemma (e.g., see Arnold et al.), for which computational procedures are available. Step 7 is dependent on how Step 4 is performed, but is always possible if Steps 4-6 are feasible.

Note that in step 1, an alternative is to match other properties of the transfer function including, but not limited to, a derivative of the transfer function at a set of points.

It can be noticed that our method is posed in such a way that if it terminates, accuracy, stability, and passivity are guaranteed. To find a suitable interpolant that is guaranteed to converge globally and uniformly is discussed below.

The Laguerre basis implementation is now discussed. The Laguerre basis is a preferred way to implement the present invention, however, it will be apparent to the ordinarily skilled artisan that other basis or methods are available and may be used to perform the global positive-real approximation.

Choosing a global uniform interpolant. Several approaches are possible to the global interpolation problem. One possibility is to use algorithms developed for general-purpose interpolation or data-fitting (e.g., see Carlos P. Coelho, Joel R. Phillips, and L. Miguel Silveira, A Convex Programming Approach to Positive Real Rational Approximation. In *International Conference on Computer Aided-Design*, pages 245-251, San Jose, Calif., November 2001 which is incorporated herein by reference) that guarantee passivity by construction. These algorithms are very computationally demanding. For many applications of interest, a simpler alternative is available. First, it is advantageous (although not necessary) to find some decomposition of matrix Z(s) into for instance some matrices R(s) and L(s) for which the individual matrix entries do not have sharply discontinuous behavior in the frequency parameter s. Many integral-equation-based electromagnetic field solvers for distributed systems already produce such a decomposition. In order to use our method, particular attention will need to be dedicated to making sure that such solvers generate strictly positive-real and causal system matrices.

Second, the frequency dependency of projected matrices $\hat{R}(s)$ and $\hat{L}(s)$ in (6) can then be captured for instance using the set of basis functions (e.g., see N. E. Wu and G. Gu, Discrete Fourier Transform and $h_\infty$ Approximation. *IEEE Transactions on Automatic Control*, 35(9):1044-1046, September 1990 which is incorporated herein by reference), $$E_k(s) = \left(\frac{\lambda - s}{\lambda + s}\right)^k,$$

where $\lambda$ is a positive real number. In this way we can write:

$$\hat{R}(s) = \sum_{k=0}^{\infty} \hat{R}_k E_k(s), \quad \hat{L}(s) = \sum_{k=0}^{\infty} \hat{L}_k E_k(s). \quad (8)$$

The basis created by the function $E_k(s)$, sometimes called the Laguerre basis, is a member of a larger family (e.g., see B. Ninness and F. Gustafsson, A Unifying Construction of Orthonormal Bases for System Identification. *IEEE Transactions on Automatic Control*, 42:515-521, 1997 which is incorporated herein by reference) of bases, all of which consist of sets of stable rational functions orthonormal over the imaginary axis $s=i\omega$. An interesting contrast with the Taylor series approach is that the $E_k(s)$ are, in a sense, band-limited. For $\|\omega\|>\lambda$, the $E_k(s)$ have monotonic magnitude, and for $\|\omega\|<\lambda$, they are nearly equi-ripple, much like Chebyshev polynomials. This implies that with suitable choice of $\lambda$, the approximations to R(s), L(s) will be well behaved outside the approximation interval, and convergence will be fast within it.

The Laguerre basis is particularly interesting because, under the bilinear transformation, $s=\lambda(1-z)/(1+z)$, the series expansion in terms of the basis functions $E_k(s)$ is mapped to a Fourier series of complex exponentials, since $E_k(s)=z^k$, where $z=e^{i\phi}$, $\phi\in[0,2\pi)$. The problem of rationally approximating the matrix functions $\hat{R}(s),\hat{L}(s)$ is reduced to the problem of approximating a function on the circle via a Fourier series, or equivalently computing a Discrete Fourier Transform (DFT). as the entries of $\hat{R}(s),\hat{L}(s)$ may be approximated term-wise.

Global uniform Convergence. If the entries of $\hat{R}(s),\hat{L}(s)$ are smooth when mapped to the circle, then the partial sums $\hat{R}^{(N)}(s),\hat{L}^{(N)}(s)$ converge uniformly to $\hat{R}(s),\hat{L}(s)$ $$\hat{R}^{(N)}(s) = \frac{1}{N}\sum_{k=0}^{N-1}\hat{R}_k z^k, \quad \hat{L}^{(N)}(s) = \frac{1}{N}\sum_{k=0}^{N-1}\hat{L}_k z^k. \quad (9)$$

If $\hat{R}(s),\hat{L}(s)$ are not smooth, but are continuous, it is still possible to obtain uniformly convergent approximates by summing the Fourier series in the sense of Cesaro (e.g., see G. Bachmann, L. Narici, and E. Beckenstein, *Fourier and Wavelet Analysis*, Springer-Verlag, 2000 which is incorporated herein by reference). Practically speaking, this means replacing the summations (9) by $$\hat{R}^{(N,C)}(s) = \frac{1}{N}\sum_{k=0}^{N-1}\hat{R}_k\left[1-\frac{k}{N}\right]z^k, \quad \hat{L}^{(N,C)}(s) = \frac{1}{N}\sum_{k=0}^{N-1}\hat{L}_k\left[1-\frac{k}{N}\right]z^k. \quad (10)$$

Equivalently, we may say that as successive approximates, we take the arithmetic means of the partial sums $\hat{R}^{(N)}(s),\hat{L}^{(N)}(s)$, rather than the partial sums themselves. Summation in this manner has the property of suppressing the Gibbs effect, and also insuring uniform convergence on a broader class of functions.

LEMMA 2. If the entries of $\hat{R}^{(N)}(s),\hat{L}^{(N)}(s)$ are continuous when mapped to the circle, $R^{(N,C)}(s),L^{(N,C)}(s)$ converge uniformly to $\hat{R}^{(N)}(s),\hat{L}^{(N)}(s)$ as $N\to\infty$[16].

From Lemma 2 we obtain a major result:

THEOREM 5. Given a system description $\hat{Z}(s)=\hat{R}(s)+s\hat{L}(s)$ where matrices $\hat{R}(s)$ and $\hat{L}(s)$ are causal, strictly positive real, and continuous on the imaginary axis, there exists an integer N and coefficients $R_k^{(N,C)},L_k^{(N,C)}$ for the partial sums in (10) such that the matrix rational function $\tilde{Z}(s)=R^{(N,C)}(s)+sL^{(N,C)}(s)$ is a positive-real rational interpolant of $\hat{Z}(s)$ whose error can be bounded from above by any chosen positive constant.

PROOF. This can be proven (see Daniel and Phillips, *Model Order Reduction for Strictly Passive and Causal Distributed Systems*, Proceedings of 2002 Design Automation Conference) with a slightly stronger assumption than positive realness, which introduces an error term that can be made vanishingly small, or more directly, from noting the positivity of the Fejer kernel which generates the coefficients for the summation in the sense of Cesaro, Theorem 5 proves that an order of interpolation N large enough does exist and therefore that the eight step method terminates. A practical application of the method would utilize a small N. The order of the interpolant is related to the smoothness of the function being approximated. Hence, although we could use this method to approximate H(s) or Z(s) directly, that would require evaluation of a substantial number of matching points around resonances, and most likely a very large order of the interpolant. A small N is instead needed when the method is used on some internal decomposed matrices R(s) and L(s) which are almost always continuous within a given band of interest. Out-of-band smoothness (for example, for delay functions, which create essential singularities at $\infty$) can be insured by filtering operations which must be designed to preserve passivity and causality of the original matrices.

Computing DFT coefficients. The DFT coefficients in the sums (9) can be efficiently calculated for instance using a Fast Fourier Transform (FFT) algorithm.

That is equivalent to evaluating the DFT coefficients via numerical integration using the trapezoidal rule. For functions on a circle, the trapezoidal rule is near-optimal, and achieves rapid (spectral) convergence for smooth functions. Hence the steps for one possible global approximation procedure are 1. For a desired interpolation order N, choose the size M of the FFT as some power of two: $M=2^n>N$.

2. Calculate the frequency points $s_k$ on the imaginary axis corresponding to the M equally spaced FFT points $z_k=\exp(j2\pi k/M)$, $k=1, \ldots, M$ on the unit circle using the bilinear transform: $s_k=\lambda(1-z_k)/(1+z_k)$, where $\lambda=2\pi f_0$ is a parameter to be chosen around the center of the frequency band of interest for the system response.

3. Use (6) to evaluate each individual projected matrix $\hat{R}(s_k)$ and $\hat{L}(s_k)$ at the selected frequency points $s_k$, $k=1, \ldots, M$.

4. Use an FFT algorithm to calculate the M coefficients $\hat{R}_k$ and $\hat{L}_k$ in (9) from the sequences $\hat{R}(s_k)$ and $\hat{L}(s_k)$, $k=1, \ldots, M$.

5. Apply to each of the M FFT coefficients the Cesaro's transformation in (10) and obtain the coefficients $\tilde{R}_k$ and $\tilde{L}_k$.

Note that, since the R(s) and L(s) matrices usually satisfy conjugate symmetry relations, R(s), L(s) need to be evaluated at only half the points on the circle. Also, once the M FFT coefficients are available one can construct at no additional cost several interpolants of increasing order N<M/2 simply truncating the sums in (10) to the first N coefficients.

Step 7 in the grip process provides realization as a state-space model. Having performed the global rational approximation on the projected matrix functions $\hat{R}(s)$ and $\hat{L}(s)$, the system (5) is now:

$$\left[\frac{1}{M}\sum_{k=0}^{N-1}\tilde{R}_k z^k + \lambda\left(\frac{1-z}{1+z}\right)\frac{1}{M}\sum_{k=0}^{N-1}\tilde{L}_k z^k\right]\hat{i}_m = \hat{B}v_p \quad (11)$$

where $\tilde{R}_k$ and $\tilde{L}_k$ contain already the Cesaro's correction (10) should that be necessary. We then collect the terms corresponding to the same powers of z define an augment state $$x=[z^{N-1}i_m^T z^{N-2}i_m^T \ldots z^2 i_m^T z i_m^T i_m^T]^T. \quad (12)$$

and product a finite dimension discrete linear system, Substituting $z=(\lambda-s)/(\lambda+s)$ we obtain the continuous and final system realization $$sE_c x_c = A_c x_c + B_c v_p \quad (13)$$

$$i_p = C_c x_c$$

where $$E_c = \begin{bmatrix} I & I & \ldots & 0 & 0 \\ 0 & I & \ldots & 0 & 0 \\ \ldots & \ldots & \ldots & \ldots & \ldots \\ 0 & 0 & \ldots & I & I \\ 2F_N & 2(F_N+F_{N-1}) & \ldots & 2(F_N+\ldots+F_2) & F_N+\ldots+F_1-F_0 \end{bmatrix}$$

$$A_c = \lambda \begin{bmatrix} I & -I & \ldots & 0 & 0 \\ 0 & I & \ldots & 0 & 0 \\ \ldots & \ldots & \ldots & \ldots & \ldots \\ 0 & 0 & \ldots & I & -1 \\ 0 & 0 & \ldots & 0 & -(F_N+\ldots+F_i+F_0) \end{bmatrix},$$

-continued $$B_c = -2\lambda\begin{bmatrix} 0 & 0 & 0 & 0 & \ldots & 0 & \hat{B} \end{bmatrix}^T,$$

$$C_c = \hat{B}*\begin{bmatrix} 0 & 0 & 0 & 0 & \ldots & 0 & I \end{bmatrix},$$

$$F_k = \begin{cases} \frac{1}{M}[\tilde{R}_0 + \lambda\tilde{L}_0] & k=0 \\ \frac{1}{M}[\tilde{R}_k + \tilde{R}_{k-1} + \lambda\tilde{L}_k - \lambda\tilde{L}_{k-1}] & 1 \le k \le N-1, \\ \frac{1}{M}[\tilde{R}_{N-1} - \lambda\tilde{L}_{N-1}] & k=N \end{cases}$$

Thus, the present invention provides methods for guaranteed passive model order reduction of strictly passive and causal linear systems with frequency dependent matrices (distributed systems). Our approach is based on the key idea that if a system is strictly positive-real to begin with, a globally and uniformly convergent interpolant will eventually (for a large enough order of the interpolant) be positive-real as well. Laguerre basis are a set of well-behaved uniformly convergent interpolation functions whose coefficients can be conveniently calculated using the FFT algorithm. An implementation using a Laguerre basis as interpolant is given and examples are presented. While the Laguerre basis reduces the infinite order of the original distributed system to a finite order, a standard Krylov subspace congruence transformation can still be employed to reduce the size of the matrices. The algorithm is also perfectly compatible with fast matrix-vector product algorithms.

Figure 3:
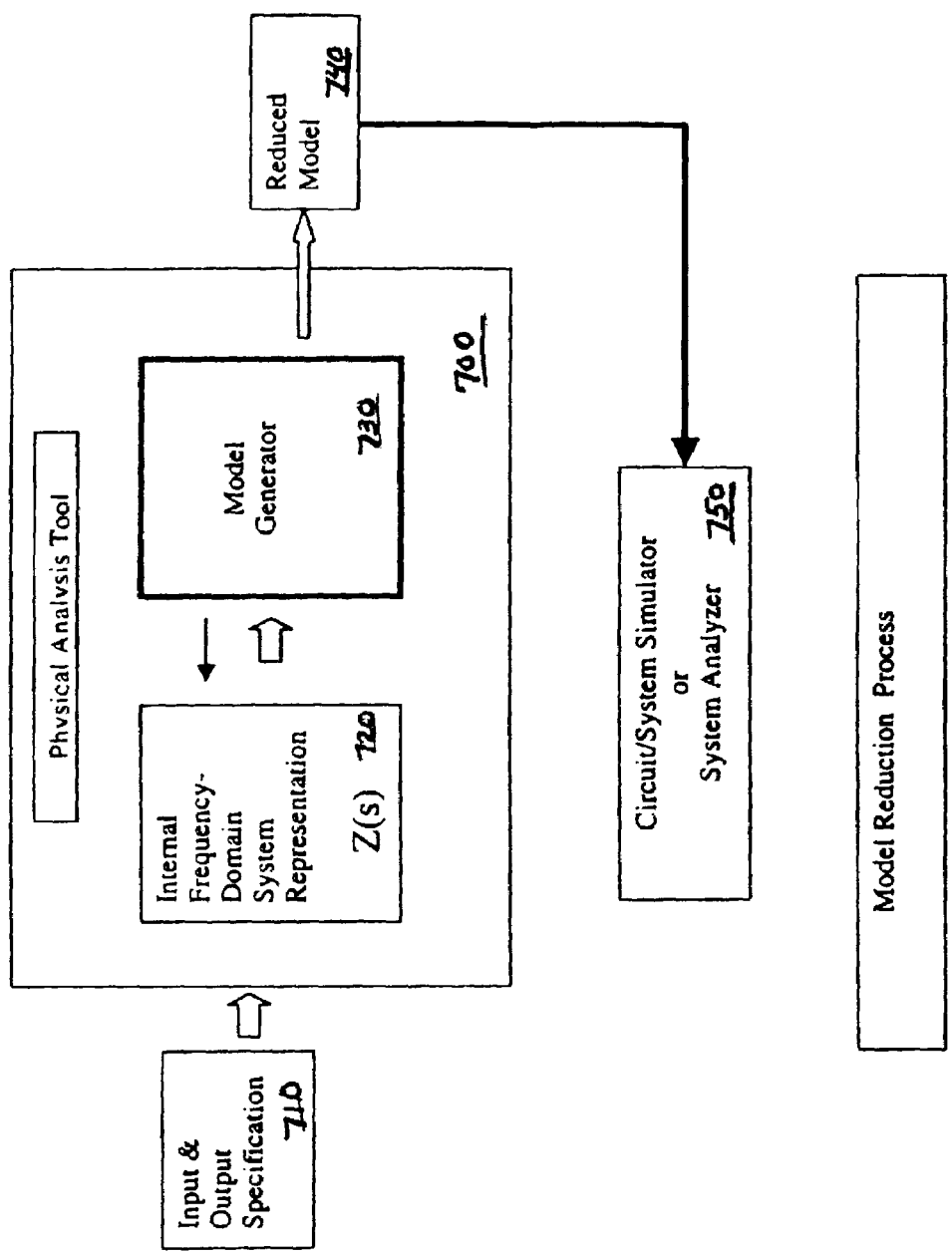
FIG. 3 is a block diagram of an architecture of a model reduction device according to the present invention.

FIG. 3 is a block diagram of an architecture of a model reduction device 700 according to the present invention. an input & output specification 710 of a system to be modeled (e.g., a metal or other material) is input into the model reduction device 700. The model reduction device 700 is a physical analysis tool which determines Internal Frequency Domain representations 720 of the system being modeled. A model generator 730 produces a reduced order model according to the processes and methods described herein. These processes are computer based programming, or a combination of electronics, software and/or other devices configured as described by the present invention. The reduced order model 740 is then utilized in a circuit simulator or other analysis tool 750. The reduced order model 740 may also be used as a component of another system.

In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner. For example, when describing interpolation, summation of specific sequences, or calculation of a basis, it is intended that any other equivalent operation or device implementing that operation having an equivalent function or capability, whether or not listed herein, may be substituted therewith.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art based on the present disclosure.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Data used by the software may be retrieved from different sources (local or remote) and either permanently or temporarily stored (before, during, or after any processing) by utilizing any of text files, delimited files, database(s), or other storage techniques. Ultimately, such computer readable media further includes software for performing the present invention, as described above.

Included in the programming (software) of the general/specialized computer or microprocessor are software modules for implementing the teachings of the present invention, including, but not limited to, deriving representations of distributed time invariant systems, computing bases, interpolation, matrix projection, including orthogonal projections and projecting system matrices as state-space systems, testing passivity and accuracy, convergence operations, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method of order reduction system for describing an electronic component in circuit simulation or analysis tools, the method comprising:
   determining a set of points from a representation of a distributed time invariant system of a component used in the design of an Integrated Circuit (IC);
   computing a basis for a projection operation of the set of points;
   projecting system matrices to obtain smaller matrices;
   performing a global interpolation of the smaller matrices;
   verifying a passivity and accuracy of the interpolants of the smaller matrices and if the interpolants of the smaller matrices are not passive and accurate, increasing an order of the global interpolant;
   reformatting the interpolant projected system matrices as a state-space system;
   utilizing the state-space system as a simplified model of the component in a simulation of the component in order to reduce an amount of processing required to perform the simulation; and
   storing the state-space system in a computer-readable medium.

2. The method according to claim 1, wherein at least one of said points are confluent.

3. The method according to claim 1, wherein said representation is an internal representation of the distributed time invariant system.

4. The method according to claim 1, wherein said representation is a transfer function of the distributed time invariant system.

5. The method according to claim 4, wherein:
   the transfer function is a transfer function including network ports; and
   said set of points comprises points of the transfer function at the network ports.

6. The method according to claim 4, further comprising the step of:
   testing accuracy of the transfer function; and
   if the tested accuracy is insufficient for a simulation using the reduced order system, then, determining additional points in said set of points and repeating said steps of computing a basis, projecting system matrices, performing a global interpolant, and reformatting.

7. The method according to claim 1, further comprising the step of performing a second stage optimal or near-optimal reduction step.

8. The method according to claim 7, wherein said second stage optimal reduction step is a guaranteed passive reduction.

9. The method according to claim 7, wherein said second stage reduction step projects the system matrices into principle coordinates defined by a storage function.

10. The method according to claim 1, wherein said step of projecting comprises projecting internal system matrices to obtain the smaller matrices.

11. The method according to claim 10, wherein said internal matrices are a resistive matrix $R(s)$ and a partial inductive matrix $L(s)$.

12. The method according to claim 10, wherein said projection is an orthogonal projection.

13. The method according to claim 11, wherein: said projection is an orthogonal projection is performed via a congruence transformation.

14. The method according to claim 1, wherein said step of performing a global interpolant comprises one of interpolation and data fitting.

15. The method according to claim 1, wherein:
   said step of performing a global interpolant comprises the steps of,
   choosing a global uniform interpolant for the frequency domain representation, and
   increasing the properties of the global interpolant by asymptotically inducing a global uniform convergence of the interpolant.

16. The method according to claim 15, wherein said step of choosing a global uniform interpolant comprises capturing a frequency dependent projected matrix $\hat{A}(s)$ via a basis calculation.

17. The method according to claim 16, wherein the frequency dependent projected matrix $\hat{A}(s)$ comprises a projected resistive matrix $\hat{R}(s)$ and a projected inductive matrix $\hat{L}(s)$.

18. The method according to claim 16, wherein said basis calculation comprises at least one of a family of bases that comprise sets of rational functions orthonormal over an imaginary axis S=iiω.

19. The method according to claim 16, wherein said basis is a Laguerre basis.

20. The method according to claim 16, wherein:
said step of capturing frequency dependent projected matrices comprises capturing a projected resistive matrix and a projected inductive matrix is performed by utilizing a set of basis functions.

21. The method according to claim 15, wherein inducing a global uniform convergence comprises determining an arithmetic means of partial sums of a projected resistive matrix and a projected inductive matrix.

22. The method according to claim 19 comprising:
choosing a size M of a Discrete Fourier Transform (DFT);
calculating frequency points sk on an imaginary axis corresponding to M points on the unit circle after bilinear transformation;
evaluating each of individually projected matrices at each of the frequency points sk;
calculating M coefficients $\hat{R}_k$ and $\hat{L}_k$ for using a DFT algorithm; and
retaining a set of size N Fourier coefficients $\hat{R}_k$ and $\hat{L}_k$ with N less than or equal to M in order to form the global interpolant.

23. The method according to claim 22, wherein:
the coefficients are N Fourier coefficients; and
said step of creating the global interpolant comprises applying a Cesaro transform to the set of N Fourier coefficients.

24. The method according to claim 19 comprising:
choosing a size M of a Fast Fourier Transform (FFT);
calculating frequency points sk on an imaginary axis corresponding to M points on the unit circle after bilinear transformation;
evaluating each of individually projected matrices at each of the frequency points sk;
calculating M coefficients $\hat{R}_k$ and $\hat{L}_k$ using a FFT algorithm; and
retaining a set of size N of coefficients $\hat{R}_k$ and $\hat{L}_k$ with N less than or equal to M in order to form the global interpolant.

25. The method according to claim 24, wherein said step of choosing a size M of an FFT comprises choosing the size M as a power of 2 such that M=2n>N.

26. The method according to claim 22, wherein said step of calculating frequency points sk on an imaginary axis comprises M equally spaced FFT $Z_k$ points according to,
$z_k$=exp(j2πk/M), k=1, . . . , M on the unit circle using the bilinear transform:
$s_k$λ(1−$z_k$)(1+$z_k$), where λ=2π$f_0$ is a parameter at a center frequency $f_0$ of a frequency band of interest or response of the system.

27. The method according to claim 22, wherein said step of calculating M coefficients $\hat{R}_k$ and $\hat{L}_k$ using an FFT algorithm from a sequence comprising:

$$\hat{R}^{(N)}(s) = \frac{1}{N}\sum_{k=0}^{N-1}\hat{R}_k z^k, \quad \hat{L}^{(N)}(s) = \frac{1}{N}\sum_{k=0}^{N-1}\hat{L}_k z^k$$

where N is an order of the sequence and Z comprises $e^{i\Phi}$.

28. The method according to claim 1, wherein the distributed time invariant system is not expressible in lumped or state-variable form.

29. The method according to claim 1, wherein said global interpolant is rational and controlled by a stable interpolant.

30. The method according to claim 1, wherein:
said method is embodied in a set of computer instructions stored on a computer readable media; and
said computer instructions, when loaded into a computer, cause the computer to perform the steps of said method.

31. The method according to claim 30, wherein said computer instruction are compiled computer instructions stored as an executable program on said computer readable media.

32. A method for creating a simplified model of an electronic component for use in a circuit simulation or analysis tool, the method comprising:
deriving a distributed, frequency based model describing behavior of a material;
reducing an order of the model; and
utilizing the reduced order model in a simulation of a component described by the material in order to reduce an amount of processing required to perform the simulation;
wherein said step of reducing comprises the steps of:
determining a set of points from a representation of the distributed, frequency based model;
computing a basis for a projection operation of the set of points;
projecting system matrices to obtain smaller matrices;
performing a global interpolation of the smaller matrices;
verifying a passivity and accuracy of the interpolants of the smaller matrices and if the interpolants of the smaller matrices are not passive and accurate, increasing an order of the global interpolant;
reformatting the interpolant projected system as a state-space system, wherein the state-space system is a simplified model of the electronic component; and
storing the state-space system in a computer-readable medium.

33. A method for creating a simplified model of an electronic component, the simplified model for use in a circuit simulation or analysis tool, the method comprising:
a) determining a set of points matching a transfer function at the network ports of a component to be modeled;
b) computing a basis for a projection operation of the set of points;
c) projecting internal system matrices to obtain reduced matrices;
d) performing a global and uniform interpolation of the reduced internal system matrices to create matrix interpolants;
e) verifying a passivity, a positive-realness, and an accuracy of the matrix interpolants, wherein if the matrix interpolants are not passive, or if the matrix interpolants are not positive-real, or if the matrix interpolants are not accurate, repeat the step d) of performing a global and uniform interpolation and increase an order of the global interpolant;
f) verifying an accuracy of a reduced model transfer function, wherein if the reduced model transfer function is not accurate, go to step a) and add additional matching points;
g) reformatting the matrix interpolants as a state-space system;

h) utilizing the state-space system as a simplified model of the component in a simulation of the component in order to reduce an amount of processing required to perform the simulation; and i) storing the state-space system in a computer-readable medium.

34. The method of claim 33, further comprising performing a second-stage guaranteed-passive optimal reduction step.

35. The method of claim 33, wherein the step of determining a set of points comprises determining a set of points matching a derivative of a transfer function at the network ports of a component to be modeled.

36. A system comprising:

a processor;

executable computer code for execution on the processor, the executable computer code causing the execution of the steps of:

a) determining a set of points matching a transfer function at the network ports of an electronic component to be modeled;

b) computing a basis for a projection operation of the set of points;

c) projecting internal system matrices to obtain reduced matrices;

d) performing a global and uniform interpolation of the reduced internal system matrices to create matrix interpolants;

e) verifying a passivity, a positive-realness, and an accuracy of the matrix interpolants, wherein if the matrix interpolants are not passive, or if the matrix interpolants are not positive-real, or if the matrix interpolants are not accurate, repeat the step d) of performing a global and uniform interpolation and increase an order of the global interpolant;

f) verifying an accuracy of a reduced model transfer function, wherein if the reduced model transfer function is not accurate, go to step a) and add additional matching points; and g) reformatting the matrix interpolants as a state-space system;

wherein the state-space system is a simplified model of the electronic component.

37. The system of claim 36, further comprising a circuit simulation tool, wherein the simplified model of the electronic component is used in the simulation tool to simulate the operation of the electronic component in a circuit.

38. A computer readable media including computer program code for creating a reduced model of an electronic component, the computer readable media comprising:

computer program code causing the execution of the steps of:

a) determining a set of points matching a transfer function at the network ports of an electronic component to be modeled;

b) computing a basis for a projection operation of the set of points;

c) projecting internal system matrices to obtain reduced matrices;

d) performing a global and uniform interpolation of the reduced internal system matrices to create matrix interpolants;

e) verifying a passivity, a positive-realness, and an accuracy of the matrix interpolants, wherein if the matrix interpolants are not passive, or if the matrix interpolants are not positive-real, or if the matrix interpolants are not accurate, repeat the step d) of performing a global and uniform interpolation and increase an order of the global interpolant;

f) verifying an accuracy of a reduced model transfer function, wherein if the reduced model transfer function is not accurate, go to step a) and add additional matching points; and g) reformatting the matrix interpolants as a state-space system.

* * * * *